United States Patent
Kim

(10) Patent No.: US 9,178,112 B2
(45) Date of Patent: Nov. 3, 2015

(54) LIGHT EMITTING DEVICE HAVING LIGHT EXTRACTION STRUCTURE

(75) Inventor: Sun Kyung Kim, Seoul (KR)

(73) Assignees: LG ELECTRONICS INC., Seoul (KR); LG INNOTEK CO., LTD., Seoul (KR)

( * ) Notice: Subject to any disclaimer, the term of this patent is extended or adjusted under 35 U.S.C. 154(b) by 323 days.

(21) Appl. No.: 13/196,648

(22) Filed: Aug. 2, 2011

(65) Prior Publication Data

US 2011/0287564 A1 Nov. 24, 2011

Related U.S. Application Data

(62) Division of application No. 12/816,258, filed on Jun. 15, 2010, now Pat. No. 8,004,003, which is a division of application No. 11/948,828, filed on Nov. 30, 2007, now Pat. No. 7,755,097.

(30) Foreign Application Priority Data

Oct. 29, 2007 (KR) ........................ 10-2007-0108745

(51) Int. Cl.
*H01L 33/20* (2010.01)
*H01L 33/50* (2010.01)
(Continued)

(52) U.S. Cl.
CPC ............... *H01L 33/20* (2013.01); *H01L 33/50* (2013.01); *H01L 33/505* (2013.01); *H01L 33/58* (2013.01); *H01L 33/44* (2013.01); *H01L 2933/0083* (2013.01)

(58) Field of Classification Search
CPC . H01L 2933/0083; H01L 33/44; H01L 33/50; H01L 33/505; H01L 33/58

USPC ................... 438/26, 27, 29, 32; 257/E33.06, 257/E21.023
See application file for complete search history.

(56) References Cited

U.S. PATENT DOCUMENTS 3,739,217 A 6/1973 Bergh et al.
5,779,924 A 7/1998 Krames et al.
(Continued)

FOREIGN PATENT DOCUMENTS

EP 2 056 368 A1 12/2007
JP 10-4209 A 1/1998
(Continued)

OTHER PUBLICATIONS

Baba, "State-of-the-Art Photonic Nanostructure Devices," IEEE International Electronics Manufacturing Technology Symposium, Proceedings 2007, Oct. 3-5, 2007, pp. 303-308.
(Continued)

*Primary Examiner* — Eva Y Montalvo
*Assistant Examiner* — Diana C Vieira
(74) *Attorney, Agent, or Firm* — Birch, Stewart, Kolasch & Birch, LLP

(57) ABSTRACT

A light emitting device having a light extraction structure, which is capable of achieving an enhancement in light extraction efficiency and reliability, and a method for manufacturing the same. The light emitting device includes a semiconductor layer having a multi-layered structure including a light emission layer; and a light extraction structure formed on the semiconductor layer in a pattern having unit structures. Further, the wall of each of the unit structures is sloped at an angle of −45° to +45° from a virtual vertical line being parallel to a main light emitting direction of the light emitting device.

14 Claims, 22 Drawing Sheets

(51) Int. Cl.
*H01L 33/58* (2010.01)
*H01L 33/44* (2010.01)

(56) References Cited

U.S. PATENT DOCUMENTS

| | | | |
|---|---|---|---|
| 6,404,031 B1* | 6/2002 | Hane et al. | 257/466 |
| 7,943,944 B2 | 5/2011 | Eisert et al. | |
| 2002/0018620 A1 | 2/2002 | Koyama et al. | |
| 2002/0117677 A1 | 8/2002 | Okuyama et al. | |
| 2003/0232179 A1* | 12/2003 | Steenblik et al. | 428/195.1 |
| 2005/0029167 A1 | 2/2005 | King et al. | |
| 2005/0123028 A1 | 6/2005 | Cioffi et al. | |
| 2005/0285132 A1 | 12/2005 | Orita | |
| 2006/0115916 A1* | 6/2006 | Lee et al. | 438/29 |
| 2006/0180941 A1* | 8/2006 | Kirby et al. | 257/774 |
| 2006/0204865 A1 | 9/2006 | Erchak et al. | |
| 2006/0208273 A1* | 9/2006 | Kang | 257/103 |
| 2007/0085102 A1 | 4/2007 | Orita | |
| 2008/0099776 A1* | 5/2008 | Lee et al. | 257/98 |
| 2008/0173887 A1 | 7/2008 | Baba et al. | |
| 2009/0066241 A1 | 3/2009 | Yokoyama | |

FOREIGN PATENT DOCUMENTS

| | | |
|---|---|---|
| JP | 2002-100805 A | 4/2002 |
| JP | 2005-535143 A | 11/2005 |
| JP | 2006-49855 A | 2/2006 |
| JP | 2006-294907 A | 10/2006 |
| JP | 2007-220971 A | 8/2007 |
| KR | 2003-0001326 A | 1/2003 |
| KR | 10-2004-0073434 A | 8/2004 |
| KR | 10-2005-0029167 A | 3/2005 |
| KR | 10-2005-0123028 A | 12/2005 |
| KR | 10-2007-0021876 A | 2/2007 |
| WO | WO 2006/103933 A1 | 10/2006 |
| WO | WO 2007/031929 A1 | 3/2007 |

OTHER PUBLICATIONS

Gao et al., "Roughening Hexagonal Surface Morphology on Laser Lift-Off (LLO) N-Face GaN with Simple Photo-Enhanced Chemical Wet Etching," Japanese Journal of Applied Physics, vol. 43, No. 5A, 2004, pp. L637-L639 (published Apr. 16, 2004).

Peng et al., "Enhanced Light Output in Double Roughened GaN Light-Emitting Diodes via Various Texturing Treatments of Undoped-GaN Layer," Japanese Jiournal of Applied Physics, vol. 45, No. 10A, 2006, pp. 7709-7712 (published online Oct. 6, 2006).

Schubert, "Light-emitting diodes," Second Edition, Sections 9.4—Textured semiconductor surfaces and 11.2—Protection against electrostatic discharge (ESD), Cambridge University Press, 2006, pp. 154-155 and pp. 193-195.

* cited by examiner

Phase Matching Condition :
$k_{mode} = k_{eff} \pm mK$

LIGHT EMITTING DEVICE HAVING LIGHT EXTRACTION STRUCTURE

CROSS-REFERENCE TO RELATED APPLICATIONS

This application is a Divisional of co-pending application Ser. No. 12/816,258 filed Jun. 15, 2010 now U.S. Pat. No. 8,004,003, which is a Divisional of application Ser. No. 11/948,828 filed Nov. 30, 2007 (now U.S. Pat. No. 7,755,097), which claims the benefit of Korean Patent Application No. 2007-0108745, filed Oct. 29, 2007. The entire contents of each of these applications are incorporated herein by reference.

BACKGROUND OF THE INVENTION

1. Field of the Invention

The present invention relates to a light emitting device, and more particularly, to a light emitting device having a light extraction structure, which is capable of achieving an enhancement in light extraction efficiency and reliability, and a method for manufacturing the same.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

Gallium nitride (GaN) compound semiconductor has been highlighted in the field of high-power electronic devices because it exhibits a high thermal stability and a wide band gap of 0.8 to 6.2 eV.

One of the reasons why a GaN compound semiconductor has been highlighted is that it is possible to fabricate a semiconductor layer capable of emitting green, blue, or white light, using GaN in combination with other elements, for example, indium (In), aluminum (Al), etc.

That is, it is possible to adjust the wavelength of light to be emitted, using GaN in combination with other appropriate elements. In other words, where GaN is used, it is possible to appropriately determine the material of the LCD in accordance with the characteristics of the apparatus to which the LCD is applied. For example, it is possible to fabricate a blue LED useful for optical recording or a white LED to replace a glow lamp.

By virtue of the above-mentioned advantages of the GaN-based material, techniques associated with GaN-based electro-optic devices have rapidly developed since the GaN-based LEDs became commercially available in 1994.

The brightness or output of an LED manufactured using the above-mentioned GaN-based material mainly depends on the structure of an active layer, the extraction efficiency associated with external extraction of light, the size of the LED chip, the kind and angle of a mold used to assemble a lamp package, the fluorescent material used, etc.

SUMMARY OF THE INVENTION

Accordingly, the present invention is directed to a light emitting device having a light extraction structure and a method for manufacturing the same that substantially obviate one or more problems due to limitations and disadvantages of the related art.

An object of the present invention is to provide a light emitting device having a light extraction structure, which is capable of achieving an enhancement in a light extraction efficiency, and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device includes a semiconductor layer having a multi-layered structure including a light emission layer; and a light extraction structure formed on the semiconductor layer in a pattern having unit structures, the wall of each of the unit structures being sloped at an angle of −45° to +45° from a virtual vertical line being parallel to a main light emitting direction of the light emitting device.

In another aspect of the present invention, a light emitting device includes a semiconductor layer having a multi-layered structure including a light emission layer; and a light extraction structure formed on the semiconductor layer in a pattern having unit structures, the radius ($r_o$) of each of the unit structures on the outer surface and the radius ($r_i$) of each of the unit structures on the inner surface being different ($r_o \neq r_i$).

In another aspect of the present invention, a light emitting device includes a semiconductor layer having a multi-layered structure including a light emission layer; and a light extraction structure formed on the semiconductor layer in a pattern having unit structures, the period of the pattern or the average distance between the centers of the neighboring unit structures being 400~3,000 nm.

In another aspect of the present invention, a light emitting device includes a semiconductor layer having a multi-layered structure including a light emission layer; and a light extraction structure formed on the semiconductor layer in a pattern having unit structures, the average filling factor of the pattern being 5~65% of the total area of a main light emission surface.

In yet another aspect of the present invention, a method for manufacturing a light emitting device includes applying a mask layer on a light extraction layer for forming a light extraction structure; forming a pattern having unit structures, each of which is a hole shape, on the mask layer, the wall of each of the unit structures being sloped at an angle of −45° to +45° from a virtual vertical line being parallel to a main light emitting direction of the light emitting device; and forming the light extraction structure using the mask layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
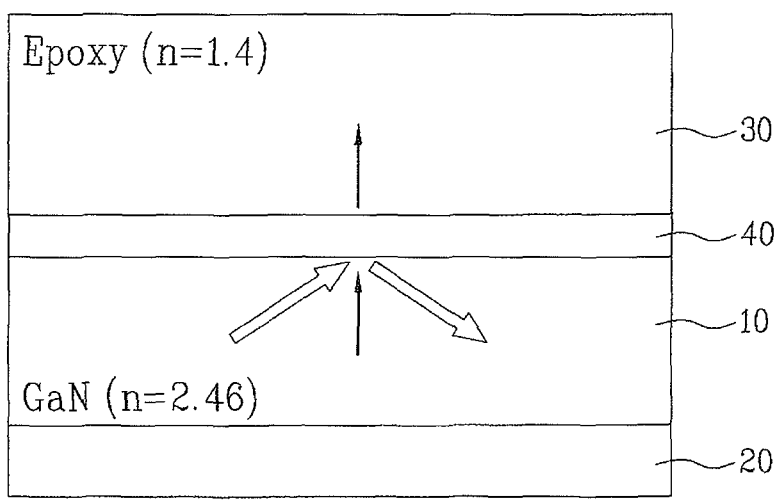
FIG. 1 is a schematic view illustrating light extraction of a light emitting device having an anti-reflection coating layer.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element such as a layer, region or substrate is referred to as being "on" another element, it can be directly on the other element or intervening elements may also be present. It will also be understood that if part of an element, such as a surface, is referred to as "inner," it is farther from the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

Preferred embodiments of the present invention will be described, for example, with reference to a gallium nitride (GaN)-based light emitting device (LED) formed on a non-conductive substrate such as a sapphire ($Al_2O_3$)-based substrate. However, the present invention is not limited to such a structure.

The embodiments of the present invention may employ other kinds of substrates including a conductive substrate. Therefore, the embodiments of the present invention may include AlGaInP diodes on a GaP substrate, GaN diodes on an SiC substrate, SiC diodes on a sapphire substrate, and/or any combination of nitride-based diodes on GaN, SiC, AlN, ZnO and/or other substrates. Further, in the present invention, use of an active region is not limited to diode regions. In addition, other forms of the active region may be employed in compliance with some embodiments of the present invention.

The extraction efficiency of a semiconductor light emitting device is determined by a difference of refractive indexes between a semiconductor layer including a light emission layer generating light and a medium (air or epoxy) in which light is finally observed. The semiconductor medium generally has a high refractive index (n>2), and thus has an extraction efficiency of no more than several %.

For example, in a GaN (n=2.46)-based light emitting device having a reflection film 20, as shown in FIG. 1, on the assumption that an external material located on a semiconductor layer is epoxy (epoxy:n=1.4:30) used as a filler in general packages, an extraction efficiency through an upper layer of the light emitting device is no more than approximately 9%. Remaining part of light is confined in the device by total internal reflection, and is destroyed by an absorption layer, such as a light emission layer having a quantum well structure.

A method for increasing the extraction efficiency of a semiconductor light emitting device is to introduce an anti-reflection coating layer 40 on the uppermost part of the semiconductor layer 10. As shown in FIG. 1, in the case that a material having a refractive index corresponding to the geometric average of those of an external medium (epoxy 30) and the semiconductor layer 10 is stacked to a thickness having a quarter-wave difference, the transmittance to light, which is incident in the perpendicular direction, can be increased.

The refractive index (n) and the thickness (d) of the above anti-reflection coating layer 40 are expressed by the below equations.

$$n = \sqrt{n_{GaN} n_{Epoxy}} = 1.86$$

$$d = \frac{\lambda}{4}(2m+1)$$

Here, m represents a natural number including zero (0).

Figure 2:
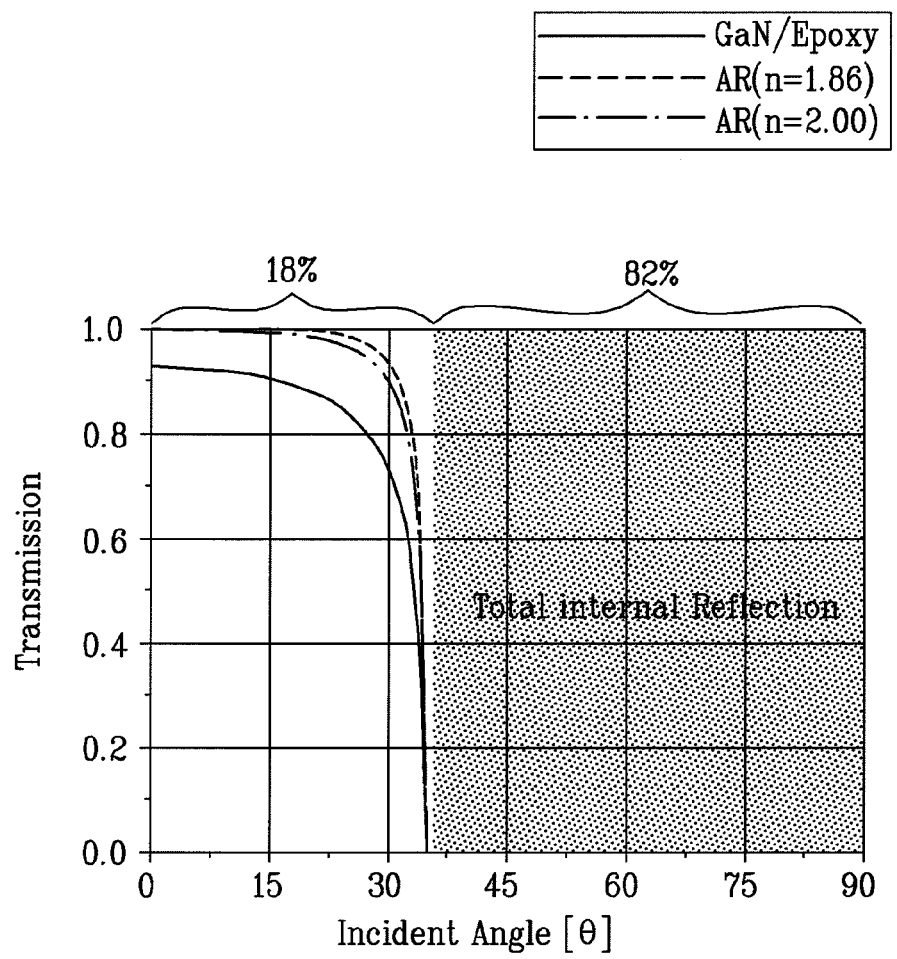
FIG. 2 is a graph illustrating a variation of transmission according to a variation of an incident angle with and without the anti-reflection coating layer.

FIG. 2 is a graph illustrating a variation of transmission according to a variation of an incident angle with and without the anti-reflection coating layer 40. The incident angles are divided into two regions on the basis of a critical angle. When light has an incident angle smaller than the critical angle, the transmission is increased with the anti-reflection coating layer 40.

On the other hand, when light has an incident angle larger than the critical angle, i.e., corresponds to a total internal reflection region, the transmission is still zero (0) regardless of the existence or non-existence of the anti-reflection coating layer 40. Consequently, the anti-reflection coating layer 40 contributes to the enhancement of the extraction efficiency of light having an incident angle smaller than the critical angle, but cannot disturb the total internal reflection yet.

In terms of a light extraction rate according to an incident angle, in consideration of that light corresponding to total internal reflection angles accounts for 80% of the total amount of light, a light extraction efficiency enhancing effect cannot be expected unless the light corresponding to this region is not extracted.

Accordingly, in order to enhance the light extraction efficiency of a light emitting device, a structural apparatus for extracting light corresponding to total internal reflection angles is required. A light extraction structure, such as a photonic crystal, serves as an example of the apparatus.

From a motional point of view, the transmission of light refers to the movement of light through materials having different refractive indexes. In the same manner as the movement of an article in dynamics, the movement of light follows conservation of momentum.

In the case of light, the momentum corresponds to a wave vector (k=2πn/λ). That is, when light moves through different media, a plane component of the momentum at the interface must be conserved. For the definite explanation, the total internal reflection is described.

The total internal reflection occurs when light moves from a medium having a high refraction index to a medium having a low refraction index. Since light in the medium having the high refraction index already has a large momentum, the light possesses the momentum (of a plan component) at a designated incident angle or more, which cannot be obtained in the medium having the low refraction index at any angle.

In order to transmit the light, the momentum of the plane component must be conserved. Thus, the light has no choice but to be reflected. Here, the minimum incident angle, which cannot conserve the momentum, corresponds to the critical angle.

Figure 3:
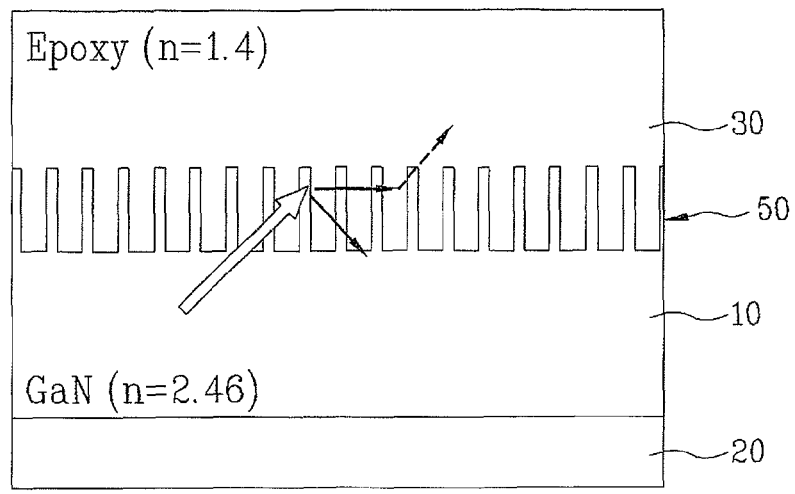
FIG. 3 is a schematic view of a light emitting device having a photonic crystal.
Figure 4:
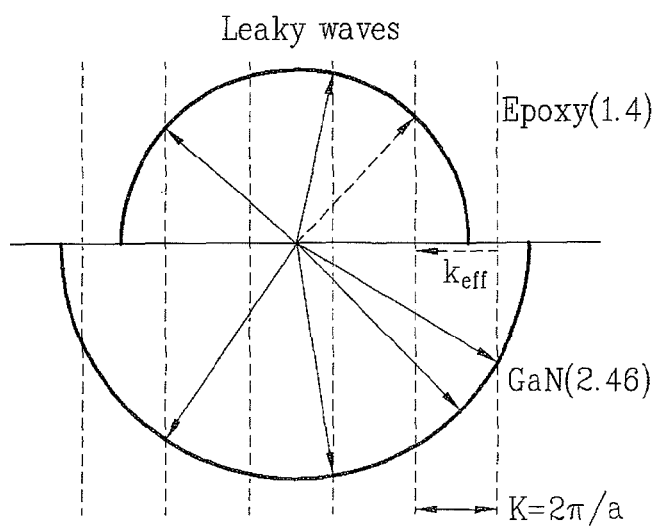
FIG. 4 is a diagram illustrating the principle of the photonic crystal.

Here, as shown in FIGS. 3 and 4, a light extraction structure 50, such as a photonic crystal (hereinafter, the photonic crystal will be described.), adds or subtracts a momentum component generated by the periodicity thereof to or from light having a total internal reflection angle, which cannot conserve a momentum, thereby assisting the light to be extracted to the outside. It is the same as a light diffraction principle in a spectroscope. That is, the intensity of the momentum is varied according to the period of the photonic crystal 50, and thus the diffraction efficiency of the light corresponding to a total internal reflection angle is varied.

Figure 5:
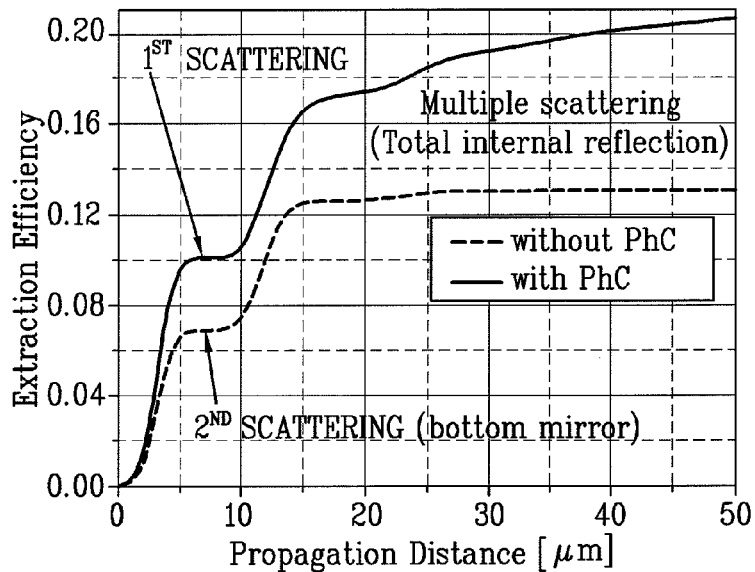
FIG. 5 is a graph illustrating a variation of an extraction efficiency with and without the photonic crystal.

FIG. 5 is a graph illustrating a variation of an extraction efficiency according to the propagation distance of light, when a photonic crystal is applied to a general GaN light emitting device having a vertical topology. As shown in this graph, in a plane structure without a photonic crystal, lights having incident angles smaller than the critical angle are extracted, and the extraction efficiency is not enhanced any more. On the other hand, in a plane structure with the photonic crystal, whenever light collides with the photonic crystal, the extraction efficiency is continuously enhanced.

Figure 6:
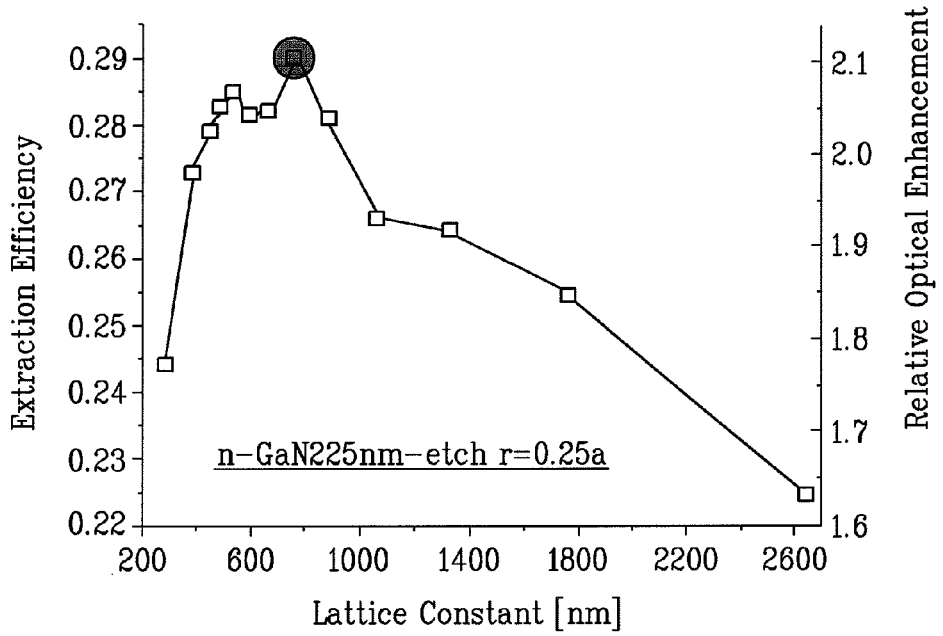
FIG. 6 is a graph illustrating a variation of an extraction efficiency according to a period of the photonic crystal.

That is, the photonic crystal can extract even light having an angle corresponding to the total internal reflection region, and it means that the light is extracted at a designated probability for every scattering process. FIG. 6 is a graph illustrating a variation of an extraction efficiency according to the period of the photonic crystal, as described above.

The fact that there is an optimum period for maximizing the extraction efficiency disproves that the enhancement of the extraction efficiency through the photonic crystal is caused by a light diffraction process.

Figure 7A:
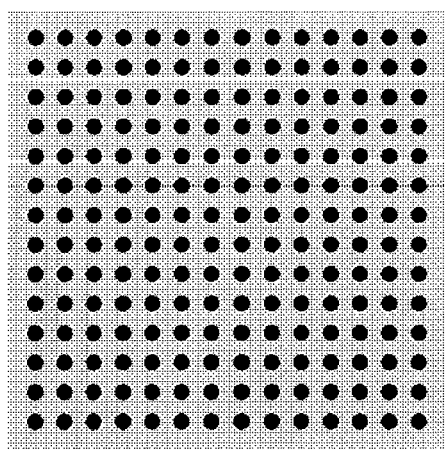
FIGS. 7A to 8C are schematic views illustrating various factors of a photonic crystal.
Figure 7B:
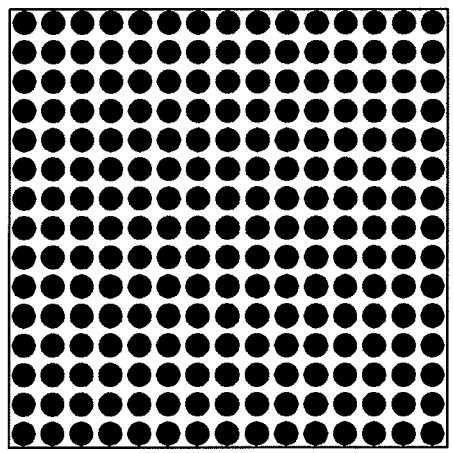

The light extraction efficiency by the photonic crystal is closely related to process variables, such as a depth of a pattern forming the photonic crystal, a filling factor of the pattern (the dimensions occupied by a unit structure of the pattern: FIGS. 7A and 7B), and a lattice structure of the photonic crystal (FIGS. 8A to 8C), in addition to the period of the photonic crystal.

Figure 8A:
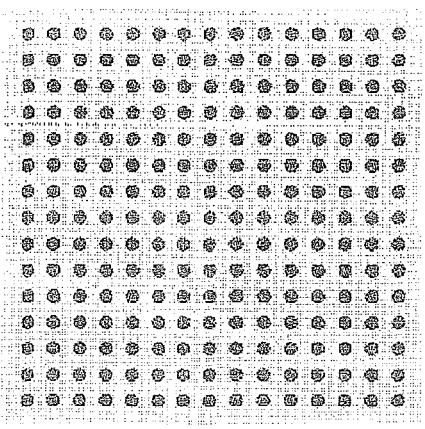
Figure 8B:
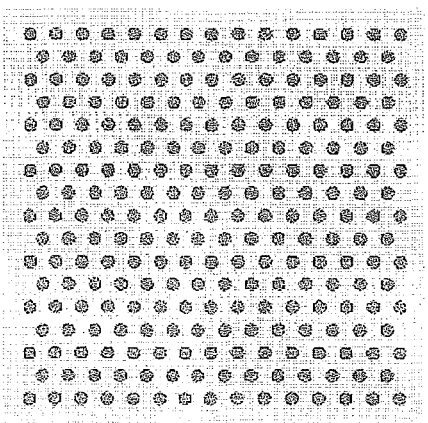
Figure 8C:
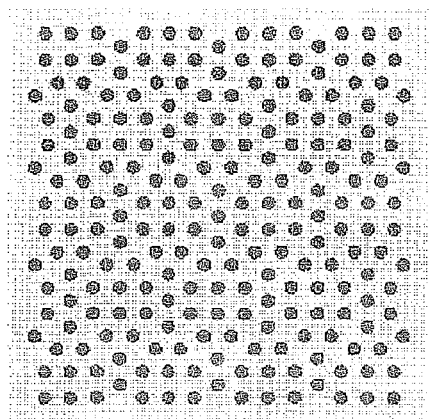

That is, it is understood that the filling factor in FIG. 7B is larger than the filling factor in FIG. 7A. Further, FIG. 8A illustrates a rectangular lattice structure, FIG. 8B illustrates a triangular lattice structure, and FIG. 8C illustrate an Archimedean lattice structure. Additionally, various lattice structures of the photonic crystal, such as a random lattice structure, a Quasi-crystal lattice structure, and a Quasi-random lattice structure, may be applied.

As described above, in order to obtain a high extraction efficiency enhancing effect in a semiconductor light emitting device, it is important to design and apply the optimum structure of the photonic crystal.

This structure of the photonic crystal may be obtained by various lithography methods. Hereinafter, photolithography will be described.

Figure 9:
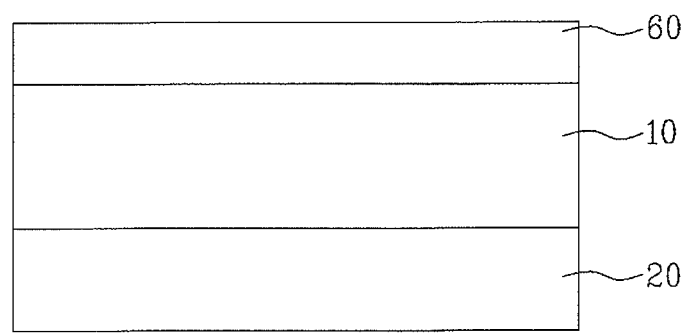
FIGS. 9 to 12 are sectional views illustrating steps for forming a photonic crystal.
Figure 10:
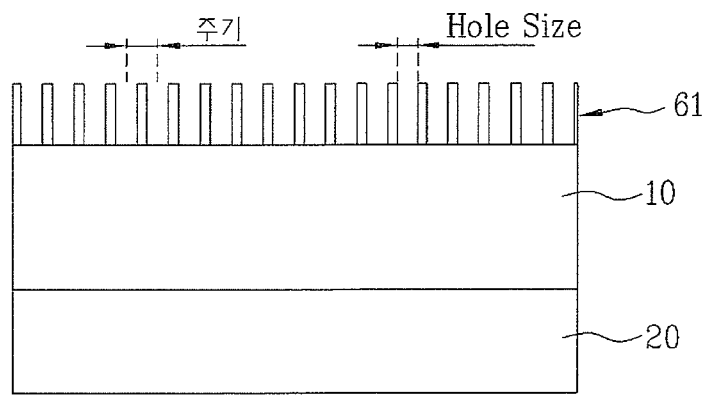

First, as shown in FIG. 9, a photoresist 60 is applied with a uniform thickness to the uppermost layer of a light emitting device provided with a semiconductor layer 10 formed on a reflection film 20. As shown in FIG. 10, a photoresist pattern 61 is obtained by photolithography.

Figure 11:
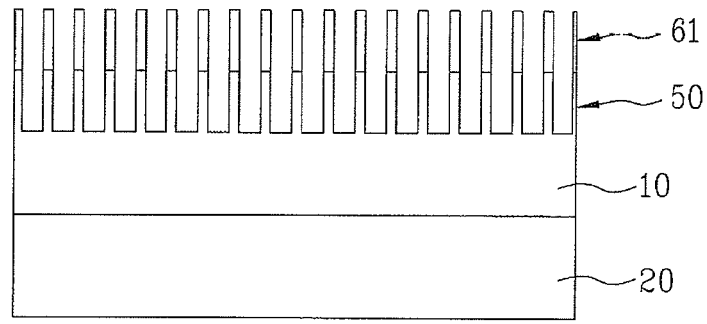
Figure 12:
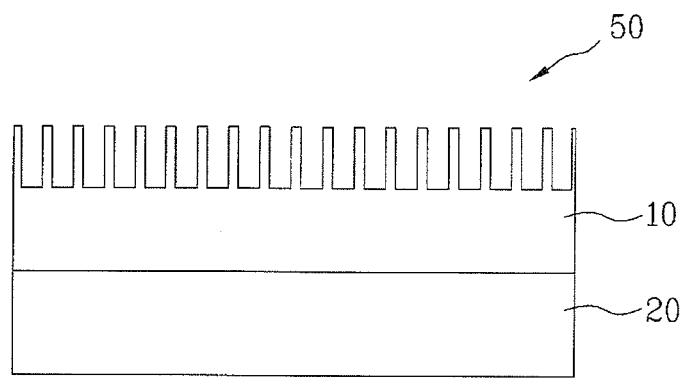

Thereafter, as shown in FIG. 11, the GaN semiconductor layer 10 is etched using the photoresist pattern 61 as an etching mask, thus producing a light extraction structure (a photonic crystal) 50. Finally, as shown in FIG. 12, the photoresist pattern 61 remaining on the uppermost layer is removed.

In the case that a desired etching depth cannot be obtained due to an etching selectivity problem between the photoresist pattern 61 and the GaN semiconductor layer 10, an additional etching mask (not shown) is interposed between the photoresist pattern 61 and the GaN semiconductor layer 10. Here, oxides, such as $SiO_2$, $TiO_2$, and ITO, and nitrides, such as $Si_3N_4$, and metals, such as Ti, Cr, Ni, and Au, may be used as the interposed mask.

Particularly, when a photonic crystal having a period several times the wavelength of a light source is patterned through photolithography, a method for minimizing a gap between a photo mask and the semiconductor layer 10 for forming the photonic crystal thereon, i.e., vacuum contact or hard contact, is required.

The larger the gap is, the more difficult it is to form a fine pattern due to a diffraction effect. Although the method for minimizing the gap, such as vacuum contact or hard contact, is employed, the smaller the size of the pattern, the larger the diffraction effect is. Further, a pattern having a size different from that of the photo mask is transcribed onto the semiconductor layer 10 according to the amount of light. This is referred to as a proximity effect.

By efficiently using the above proximity effect, it is possible to manufacture patterns having various sizes using a given photo mask. Further, as shown in FIGS. 13A and 15B, the slope of the walls of holes (or rods) forming the pattern can be adjusted.

Figure 13A:
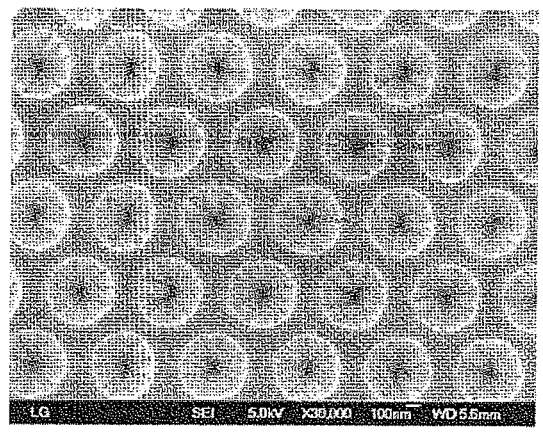
FIGS. 13A to 15B are photographs illustrating a variation of the slope of the walls of the photonic crystal.
Figure 13B:
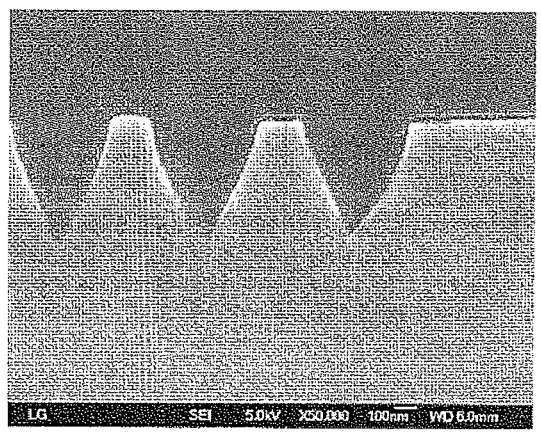
Figure 14A:
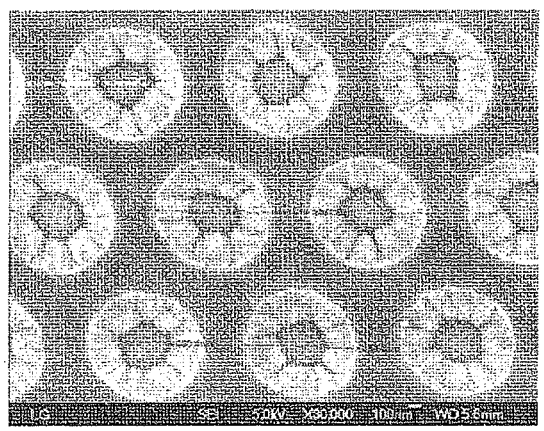
Figure 14B:
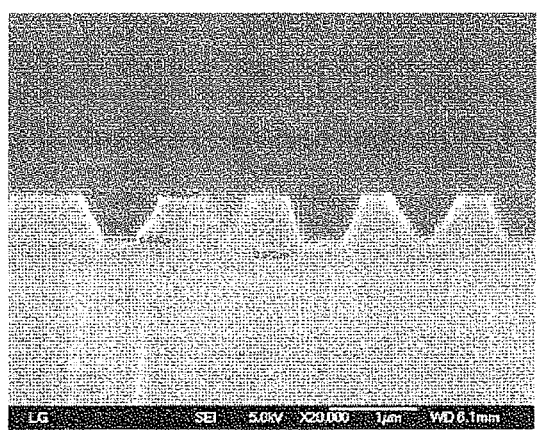
Figure 15A:
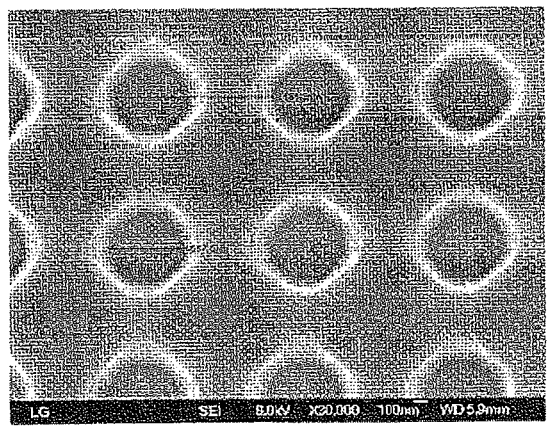
Figure 15B:
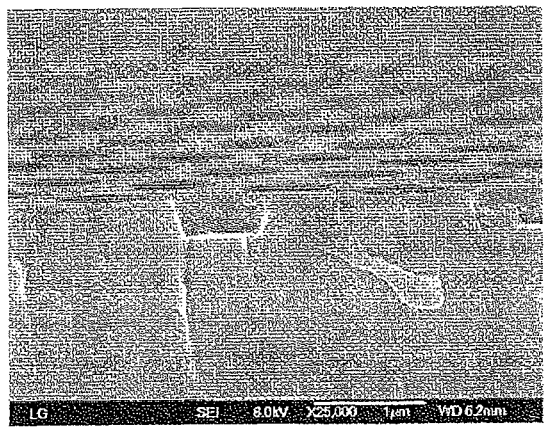

FIGS. 13A and 13B are photographs of the plane and side of a pattern having an etching slope of 60°, FIGS. 14A and 14B are photographs of the plans and side of a pattern having an etching slope of 70°, and FIGS. 15A and 15B are photographs of the plane and side of a pattern having an etching slope of 80°.

Figure 16A:
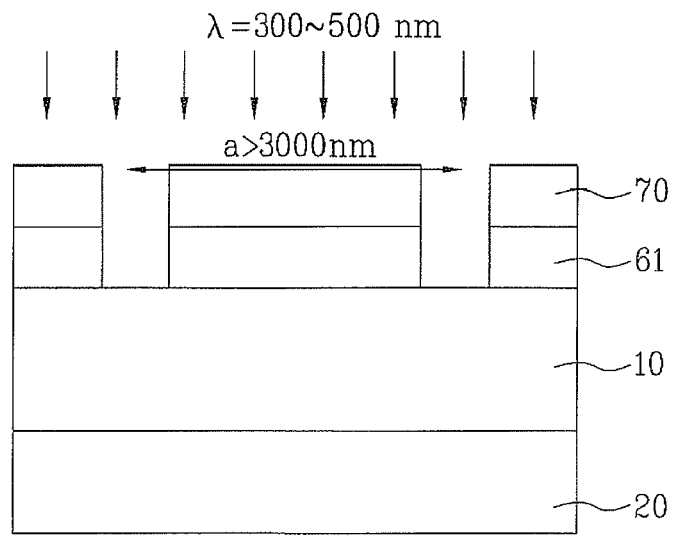
FIGS. 16A to 16C are sectional views illustrating photoresist patterns according to the period of the photonic crystal.
Figure 16B:
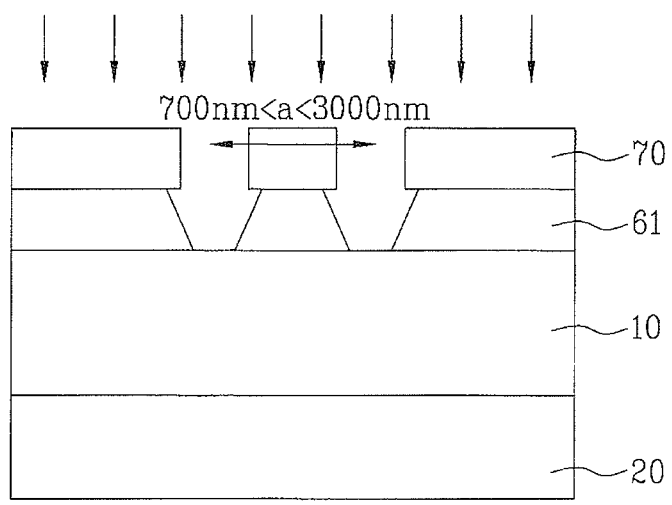
Figure 16C:
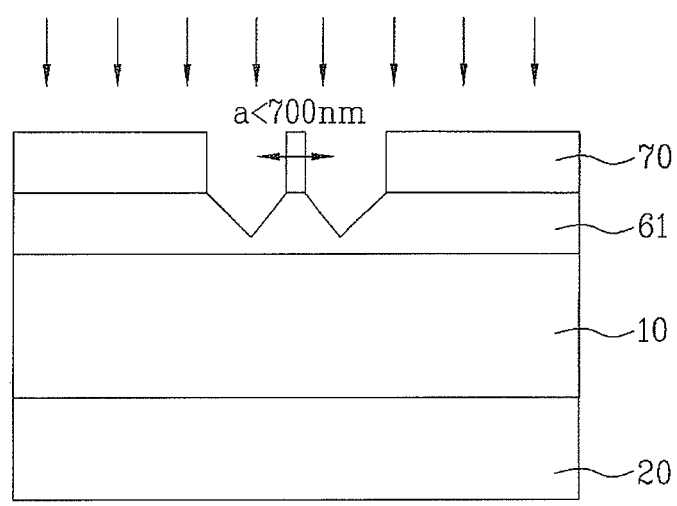

FIGS. 16A to 16C illustrate the proximity effect according to the period (a) of the photonic crystal. FIGS. 16A to 16C shows that the size of holes and the slope of the inner walls of the holes of the photonic crystal can be adjusted by an exposure light amount diffraction effect, respectively when the period of the photonic crystal is larger than 3,000 nm, when the period of the photonic crystal is in the range of 700~3,000 nm, and when the period of the photonic crystal is smaller 700 nm.

Figure 17A:
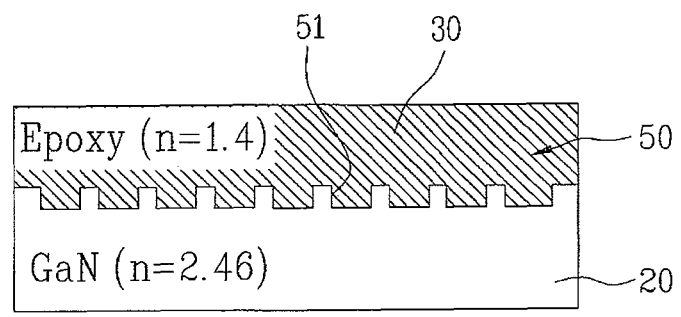
FIGS. 17A to 17C are sectional views illustrating photonic crystals having varying slopes of walls.

In the case that the period of the photonic crystal is much larger than the wavelength of a photolithography light source, the proximity effect between the respective holes (or the respective rods) of the unit pattern is ignorable, and as shown in FIG. 17A, the original shape of a photo mask 70, as it is, is transcribed onto the semiconductor layer.

Figure 17B:
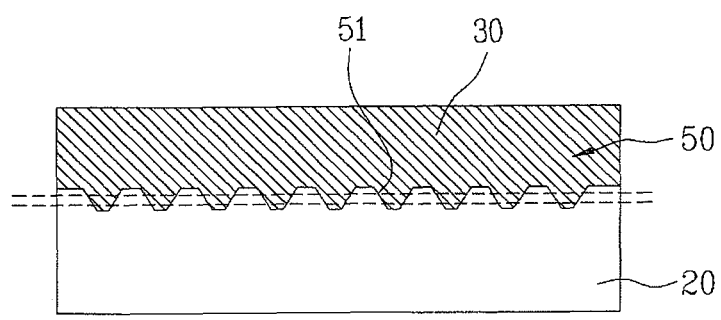
Figure 17C:
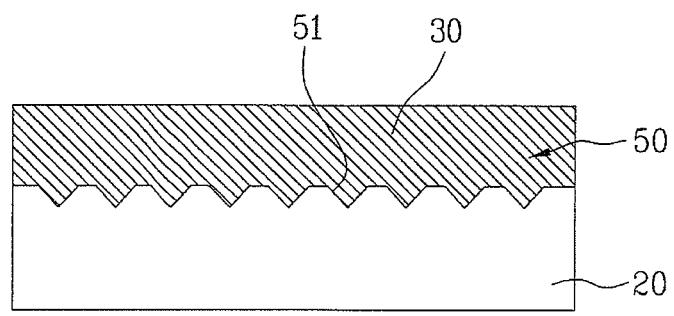

However, when the period of the photonic crystal is gradually decreased and becomes several times the wavelength of the light source, the proximity effect occurs. Here, when the amount of the exposure light is properly adjusted, a pattern of the photonic crystal 50 larger than (or smaller than) the shape of the photo mask 70 is obtained, as shown in FIGS. 17B and 17C. Thus, the slope of the walls of the holes (or the rods) 51 of the unit pattern is adjusted.

Generally, most amount of exposure light is distributed on the upper surface of the photoresist pattern 61 through forward scattering and backward scattering, thus having an equilateral trapezoidal shape, in which the upper side is larger than the lower side. Then, when the period of the photonic crystal 50 becomes smaller than the wavelength of the light source, the holes (or the rods) 51 are overlapped, and the exposure light cannot reach the bottom surface of the photoresist.

Consequently, when the period of the photonic crystal 50 in the photo mask 70 is larger than the wavelength of the light source and is smaller than several times (approximately 10 times) the wavelength, there is a possibility of adjusting the size of the holes (or the rods) 51 and the slope of the walls of the holes (or the rods) 51.

The relation between the extraction efficiency and the slope of the walls of the holes (or the rods) forming the photonic crystal will be described, as follows.

Although the photonic crystal proposed by the present invention may be applied regardless of kinds of light emitting devices, a result obtained by calculating the effect of the slope of walls of a photonic crystal of a GaN light emitting device having a vertical topology will be described for convenience of explanation.

The shape of a structure inputted using a Three-Dimensional Finite-Difference Time-Domain (3D-FDTD) simulation is illustrated in FIGS. 8A to 8C. A light emitting device having a general size cannot be completely included by a calculating structure due to the limit of a computer memory.

In order to solve this problem, a complete mirror was installed at each of both ends of a structure of a finite size (12 μm). Further, instead of a real metal mirror having a designated absorptivity, a complete mirror having a reflexibility of 100% was installed at the lower end of the structure for convenience of analysis. A real absorptivity was given to the inside of a quantum well layer (a light emission layer), so that the longer the propagation distance of light is, the smaller the intensity of the light is.

Electric dipoles having random directions were disposed in the quantum well layer, so as to generate a radiation pattern of a spherical wave similar to the real case.

Figure 18:
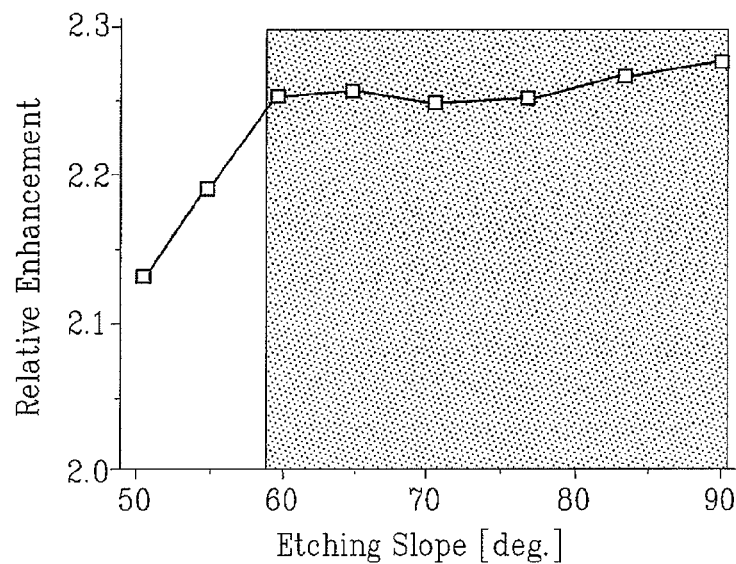
FIG. 18 is a graph illustrating a relative enhancement of the light extraction efficiency according to a slope of the walls of a photonic crystal.

FIG. 18 is a graph illustrating a variation of an extraction efficiency according to a slope of the wall of a unit structure in a photonic crystal at the same period and etching depth. That is, the graph illustrates a variation of the extraction efficiency according to the slope of the wall of the unit structure having a hole or rod shape. From the graph, it is understood that the extraction efficiency is scarcely varied at the slope of the wall from 0° to 60°.

Figure 19A:
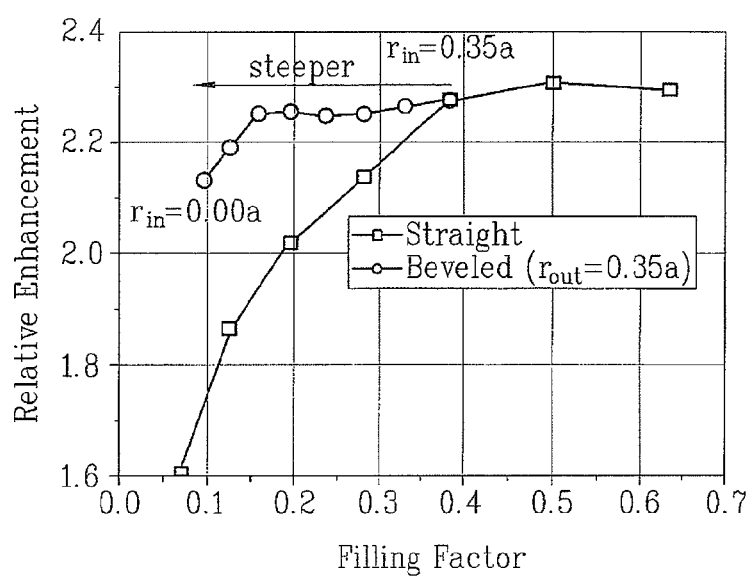
FIG. 19A is a graph illustrating a relative enhancement of the light extraction efficiency according to a filling factor.

However, when the wall becomes steeper, the extraction efficiency is decreased. FIG. 19A is a graph illustrating a relation between a filling factor and an extraction efficiency in a photonic crystal having a straight wall. In the photonic crystal having a straight wall, it is understood that the extraction efficiency is maximized when the filling factor has a value of 0.4 to 0.6.

Judging from the above tendency, as shown in the above graph, when the filling factor, i.e., the rate of the dimensions of a light extraction pattern to the total main light emission surface (in this case, a top surface of the light emitting device), is 5~65%, the light extraction efficiency is enhanced.

The above filling factor is determined by the size of the unit structure, such as the hole or the rod, or the lattice structure.

Figure 19B:
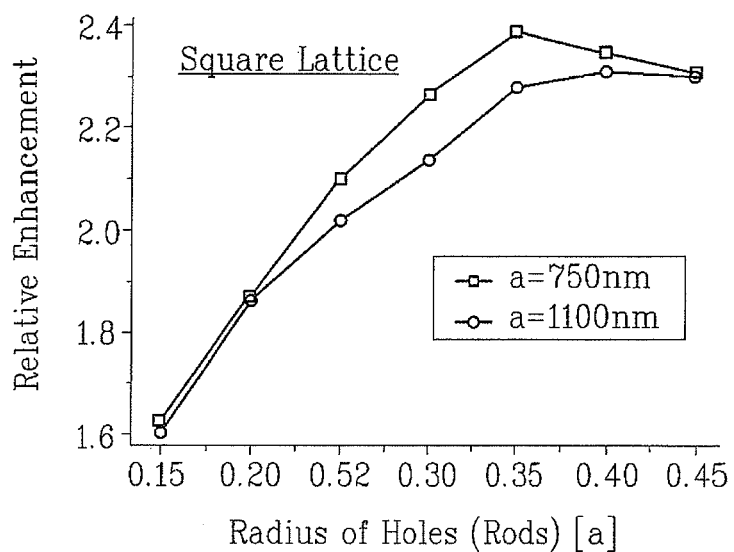
FIG. 19B is a graph illustrating a relative enhancement of the light extraction efficiency according to a radius of unit structures.

That is, FIG. 19B is a graph illustrating a relative enhancement of the light extraction efficiency according to the radius of unit structures. FIG. 19B illustrates the light extraction efficiency of a square lattice having a period of 750 nm and the light extraction efficiency of a square lattice having a period of 1,100 nm.

Figure 19C:
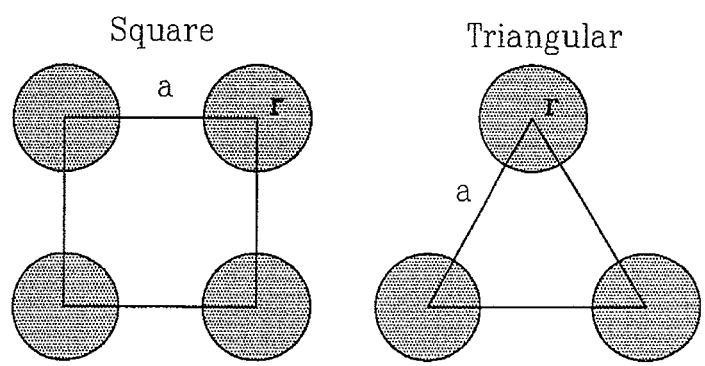
FIG. 19C schematically illustrates a square lattice and a rectangular lattice.

Further, in a square lattice and a rectangular lattice, as shown in FIG. 19C, in the case that a represents a period and r represents a radius of unit structures, the filling factors of the square lattice and the rectangular lattice are expressed by the below equations.

$$f(\text{Square}) = \pi\left(\frac{r}{a}\right)^2$$

$$f(\text{Triangular}) = \frac{2\pi}{\sqrt{3}}\left(\frac{r}{a}\right)^2$$

Figure 19D:
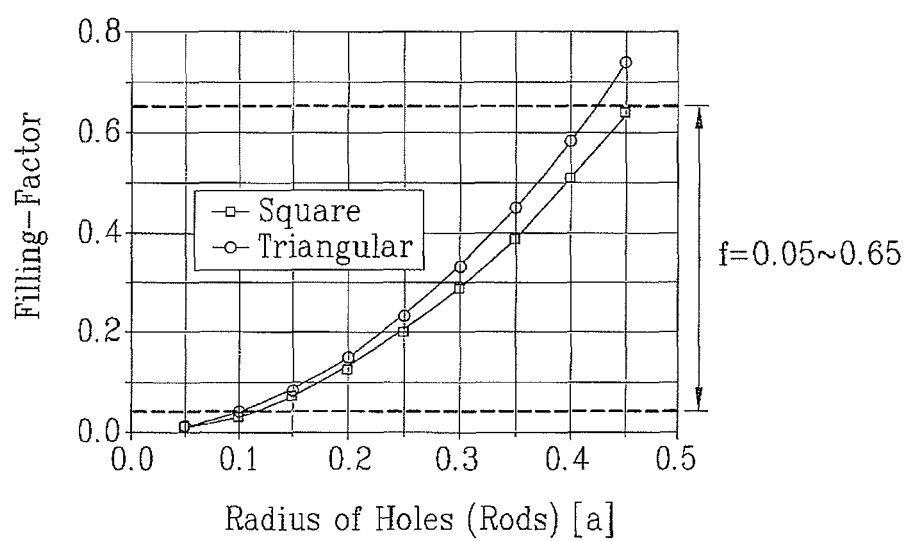
FIG. 19D is a graph illustrating a relation between a filling factor and a radius of unit structures.

FIG. 19D is a graph illustrating a relation between a filling factor and a size of unit structures in each of a square lattice and a triangular lattice. As shown in FIG. 19D, the range of the filling factor according to the size of the unit structures, which enhances the light extraction efficiency, is illustrated.

Figure 20A:
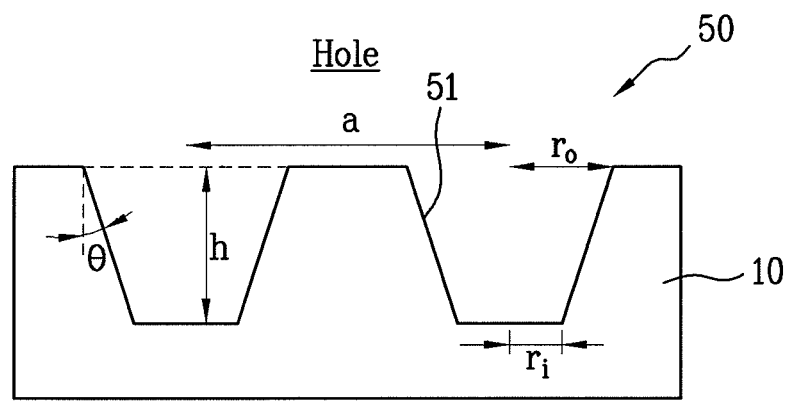
FIGS. 20A to 20C are schematic views illustrating structures of a slope of the walls of a photonic crystal.
Figure 20B:
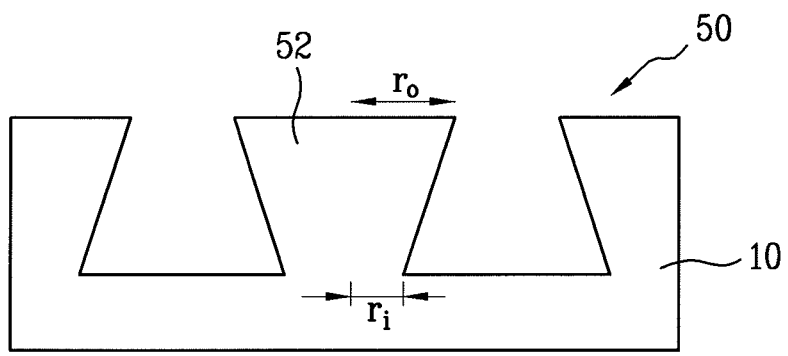

When the above results and the earlier graph illustrating a variation of the extraction efficiency according to a slope of the wall are integrated simultaneously, photonic crystals having straight walls, as shown in FIGS. 20A and 20B, may exhibit the average filling factor.

In comparison between the two photonic crystals (FIGS. 20A and 20B), an important conclusion is obtained. That is, among the two photonic crystals having the same filling factor, the photonic crystal having beveled walls has a more excellent light extraction property than the photonic crystal having straight walls. Further, the larger the slope of the wall of the photonic crystal, the more excellent the light extraction property of the photonic crystal.

Judging from the above tendency, it is understood that a light extraction structure having an excellent light extraction property is obtained when the wall of the above unit structure is sloped at an angle of −45° to +45° from a virtual vertical line being parallel to a main light emitting direction of the light emitting device.

The period of the light extraction structure or the average distance between the centers of respective unit structures is preferably 400~3,000 nm.

Further, the height (depth) of the above unit structure is preferably λ/2n~3,000 nm. Here, n represents the refraction index of a material, on which the light extraction structure is formed, and λ represents the central wavelength of the light emission layer.

The above light extraction structure is formed on the outer surface of a semiconductor layer. However, according to circumstances, the light extraction structure may be formed on a light extraction layer having a refraction index differing from that of the semiconductor layer and formed on the semiconductor layer. The light extraction layer may include two or more sub-layers, if necessary.

In this case, when the light extraction structure is formed on the semiconductor layer, n becomes the reflection index of the semiconductor layer at the lower limit of the height of the unit structure, and when the light extraction structure is formed on the light extraction layer, n becomes the reflection index of the light extraction layer. Further, when the light extraction layer includes two or more sub-layers, n becomes the highest reflection index.

The semiconductor layer or the light extraction layer, on which the above light extraction structure is formed, is configured such that the dielectric constant of the semiconductor layer or the light extraction layer is spatially varied according to a designated pattern.

Figure 20C:
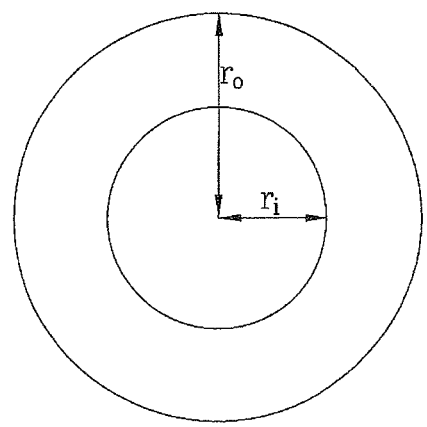

FIG. 20A illustrates the photonic crystal 50, the unit structure of which is a hole 51, and FIG. 20B illustrates the photonic crystal 50, the unit structure of which is a rod 52. FIG. 20C is a plan view of a unit structure.

The unit structure formed by the above-described process is configured such that the radius ($r_o$) of the unit structure on the outer surface and the radius ($r_i$) of the unit structure on the inner surface are different ($r_o \neq r_i$).

As shown in FIGS. 20A and 20B, in both cases that the unit structure is the hole 51 and that the unit structure is the rod 52, it is known that the radius ($r_o$) of the unit structure on the outer surface is larger than the radius ($r_i$) of the unit structure on the inner surface ($r_o > r_i$). Further, the angle (θ) of the wall of the hole 51 or the rod 52 refers to an angle from a virtual vertical line extended from the edge of the unit structure, and the angle (θ) of the wall is ±45°.

That is, this virtual vertical line is a line, which is parallel to a main light emitting direction of the light emitting device, and thus the angle (θ) of the wall of the unit structure from the virtual vertical line being parallel to the main light emitting direction of the light emitting device is ±45°.

Here, the average filling factor of a photonic crystal pattern on a light emission surface is as follows. That is, in the case that the unit structure is the hole 51, as shown in FIG. 20A, the average filling factor of the photonic crystal pattern to air or epoxy located on the light emission surface is represented by an equation "$\pi[(r_o+r_i)/2]^2$", and in the case that the unit structure is the rod 52, as shown in FIG. 20B, the average filling factor is represented by an equation "$1-\pi[(r_o+r_i)/2]^2$".

This fact provides an advantage of conserving electrical characteristics, when a photonic crystal is formed by directly etching the semiconductor layer. Generally, when the semiconductor layer is etched so as to form a photonic crystal, electrical characteristics are deteriorated in proportion to the volume of the etched layer.

However, when the photonic crystal having beveled walls proposed by the present invention is employed, it is possible to minimize the loss of a semiconductor layer without deterioration in a light extraction effect.

The above photonic crystal may be applied regardless of kinds of semiconductor materials.

Figure 21:
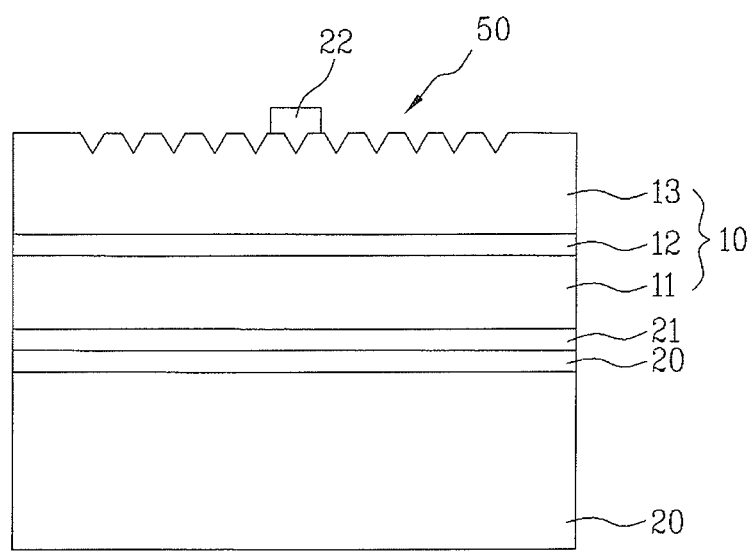
FIGS. 21 and 22 are sectional views of light emitting devices, to which a photonic crystal having a specific slope of walls is applied.
Figure 22:
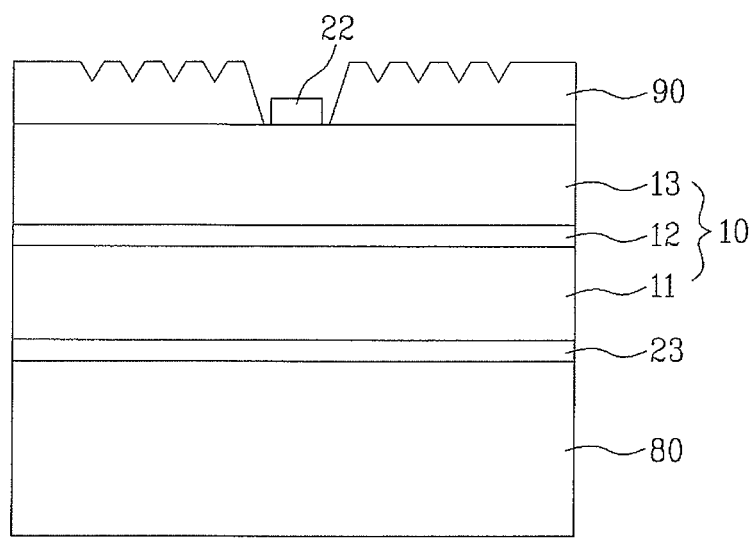

FIGS. 21 and 22 respectively illustrate light emitting devices having a vertical topology, to which the above photonic crystal 50 is applied.

That is, the photonic crystal 50 is formed on the semiconductor layer 10, which sequentially includes a p-type semiconductor layer 11, a light emission layer 12, and an n-type semiconductor layer 13 from the lower part, and the semiconductor layer 10 is located on a support layer 80 made of a metal or a semiconductor.

First electrodes 21 and 20 or a first electrode 23 is located between the semiconductor layer 10 and the support layer 80. The first electrodes 21 and 20 may include an Ohmic electrode 21 and a reflective electrode 20 (reflection film), or a single Ohmic electrode 23 may be formed. If necessary, the first electrodes may form a multi-layered structure including a binding metal layer, for the binding with the support layer 80, and a diffusion barrier layer.

Further, an n-type electrode 22 is formed on the upper surface of the n-type semiconductor layer 13, on which the light extraction structure is formed.

Here, as described above, the photonic crystal 50 may be located on/in a light extraction layer 90 located on the n-type semiconductor layer 13. The light extraction layer 90 is formed using a dielectric substance having a refraction index, which is different from that of the n-type semiconductor layer 13 or is the same as that of the n-type semiconductor layer 13.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for manufacturing a light emitting device, the method comprising:
    applying a mask layer on a dielectric layer on a semiconductor layer;
    forming a pattern into the mask layer, the pattern comprising unit structures,
    wherein the unit structures have a hole or a rod shape, and
    wherein a wall of the unit structures is sloped at an angle of −45° to +45°, from a virtual vertical line parallel to a light emitting direction of the light emitting device;
    forming a light extraction structure into the dielectric layer using the mask layer; and
    controlling an average filling factor of the pattern by adjusting at least one of a slope of the wall, a radius of the unit structures, and a lattice structure of the light extraction structure, wherein the average filling factor of the light extraction structure is more than 5% and less than 37% with respect to an area of a light emission surface of the light emitting device, and wherein the average filling factor is a ratio of an average area of the pattern with respect to a total area of a light emission surface of the light emitting device.

2. The method according to claim 1, wherein the semiconductor layer comprises GaN.

3. The method according to claim 1, wherein the step of forming the pattern comprises:

forming the pattern using photolithography.

4. The method according to claim 3, wherein a distance between centers of neighboring unit structures of the pattern is 1~10 times a wavelength of irradiated light.

5. The method according to claim 1, wherein a period of the light extraction structure or an average distance between centers of neighboring unit structures is 400~3,000 nm.

6. The method according to claim 1, wherein a period of the light extraction structure or an average distance between centers of neighboring unit structures is more than 3,000 nm.

7. The method according to claim 1, wherein a height of the unit structures is $\lambda/2n$~3,000 nm, "n" representing a refraction index of a material of the light extraction structure, and $\lambda$ representing a central wavelength of the light emitting device.

8. The method according to claim 1, wherein the unit structures has a truncated shape.

9. The method according to claim 1, wherein the light extraction structure comprises one of a rectangular lattice structure, a triangular lattice structure, an Archimedean lattice structure, a random structure, a Quasi-crystal structure, and a Quasi-random structure.

10. The method according to claim 1, wherein a slope of the wall of the unit structures is configured to enhance a light extraction efficiency of the light emitting device.

11. The method according to claim 1, wherein a light emission surface of the light emitting device is formed as a horizontally sectional virtual surface below the light extraction structure.

12. The method according to claim 1, wherein the mask layer comprises a photoresist.

13. The method according to claim 1, wherein the dielectric layer contacts the semiconductor layer.

14. A method for manufacturing a light emitting device, the method comprising:

applying a mask layer on a light extraction layer;

forming a pattern into the mask layer, the pattern comprising unit structures, wherein the unit structures have a hole or a rod shape, and wherein a wall of the unit structures is sloped at an angle of −45° to +45° from a virtual vertical line parallel to a light emitting direction of the light emitting device; and forming a light extraction structure into the light extraction layer using the mask layer, wherein an average filling factor of the light extraction structure is more than 5% and less than 37% with respect to an area of a light emission surface of the light emitting device, and wherein the average filling factor is a ratio of an average area of the pattern with respect to a total area of a light emission surface of the light emitting device.

\* \* \* \* \*